(12) United States Patent
Lai

(10) Patent No.: US 12,101,905 B2
(45) Date of Patent: Sep. 24, 2024

(54) ELECTRONIC DEVICE AND QUICK RELEASE MECHANISM

(71) Applicant: WISTRON CORP., New Taipei (TW)

(72) Inventor: Chung Yu Lai, New Taipei (TW)

(73) Assignee: WISTRON CORP., New Taipei (TW)

( * ) Notice: Subject to any disclaimer, the term of this patent is extended or adjusted under 35 U.S.C. 154(b) by 497 days.

(21) Appl. No.: 17/580,709

(22) Filed: Jan. 21, 2022

(65) Prior Publication Data

US 2023/0084855 A1  Mar. 16, 2023

(30) Foreign Application Priority Data

Sep. 15, 2021  (TW) .................................. 110134466

(51) Int. Cl.
*H05K 7/14* (2006.01)

(52) U.S. Cl.
CPC ........ *H05K 7/1488* (2013.01); *Y10T 403/608* (2015.01)

(58) Field of Classification Search
CPC ............... Y10T 403/60; Y10T 403/602; Y10T 403/604; Y10T 403/608; H05K 5/0208; H05K 5/0217; H05K 5/0221; H05K 7/14; H05K 7/1401; H05K 7/1404; H05K 7/1405; H05K 7/1409; H05K 7/1411; H05K 7/1415; H05K 7/1418; H05K 7/142; H05K 7/1474; H05K 7/1487; H05K 7/1488; H05K 7/1489; H05K 7/183
USPC ...................................................... 312/223.1
See application file for complete search history.

(56) References Cited

U.S. PATENT DOCUMENTS

| 3,851,941 | A | * | 12/1974 | Stebe | H05K 7/1421 |
| | | | | | 312/215 |
| 5,332,306 | A | * | 7/1994 | Babb | H05K 7/1418 |
| | | | | | 439/377 |
| 8,189,327 | B2 | * | 5/2012 | Chang | H05K 5/0295 |
| | | | | | 361/679.01 |
| 8,553,406 | B2 | * | 10/2013 | Liu | G06F 1/187 |
| | | | | | 361/679.33 |
| 8,690,267 | B2 | * | 4/2014 | Jiang | G06F 1/187 |
| | | | | | 361/679.33 |

(Continued)

FOREIGN PATENT DOCUMENTS

CN        105792561 A     7/2016

*Primary Examiner* — Amber R Anderson
*Assistant Examiner* — Kevin J Baynes
(74) *Attorney, Agent, or Firm* — McClure, Qualey & Rodack, LLP

(57) ABSTRACT

A quick release mechanism includes a fixed component, a first assembly, and a second assembly. The fixed component has a guiding portion and a first positioner. The first assembly includes an engagement component and a return component. The engagement component is pivotably disposed on the fixed component and includes a first protrusion part, a first press part, and a second positioner. The return component keeps the engagement component in an engaged position. The second assembly is removably inserted into the guiding portion. The second assembly includes a second protrusion part and a contact part. The engagement component is movable away from the engaged position by abutting of the second protrusion part on the first protrusion part or by abutting of the contact part on the first press part during insertion of the second assembly into the guiding portion.

20 Claims, 17 Drawing Sheets

(56) References Cited

U.S. PATENT DOCUMENTS

| | | | |
|---|---|---|---|
| 9,122,458 B2 * | 9/2015 | Yu | G06F 1/185 |
| 9,417,669 B2 * | 8/2016 | Lin | G06F 1/181 |
| 9,699,925 B2 * | 7/2017 | Yeh | G06F 1/1637 |
| 11,055,446 B2 * | 7/2021 | Shih | H05K 7/1489 |
| 2011/0262060 A1 * | 10/2011 | Yu | H05K 7/183 |
| | | | 384/21 |

* cited by examiner ial boards

ELECTRONIC DEVICE AND QUICK RELEASE MECHANISM

CROSS-REFERENCE TO RELATED APPLICATIONS

This non-provisional application claims priority under 35 U.S.C. § 119(a) on Patent Application No(s). 110134466 filed in Taiwan, R.O.C. on Sep. 15, 2021, the entire contents of which are hereby incorporated by reference.

TECHNICAL FIELD

The present disclosure relates to an electronic device and a quick release mechanism.

BACKGROUND

Generally, components of a conventional server are assembled by screwing or riveting, thus the installation and removal thereof involve troublesome steps with the use of tools, causing inconvenience to assembly, maintenance, and other associated works.

SUMMARY

The present disclosure provides an electronic device and a quick release mechanism that enable quick installation and removal of components without the use of tools.

According to one aspect of the present disclosure, a quick release mechanism includes a fixed component, a first assembly, and a second assembly. The fixed component has a guiding portion and a first positioner. The first assembly includes an engagement component and a return component. The engagement component is pivotably disposed on the fixed component and includes a first protrusion part, a first press part, and a second positioner. The return component is configured to push the engagement component so as to keep the engagement component in an engaged position. The second assembly is removably inserted into the guiding portion. The second assembly includes a second protrusion part and a contact part. The engagement component is movable away from the engaged position by abutting of the second protrusion part on the first protrusion part or by abutting of the contact part on the first press part during insertion of the second assembly into the guiding portion. The first protrusion part of the engagement component in the engaged position is configured to block the second protrusion part when the second protrusion part is located between the first protrusion part and the contact part.

According to another aspect of the present disclosure, an electronic device includes a first electronic component, a second electronic component, and a quick release mechanism. The quick release mechanism includes a fixed component, a first assembly, and a second assembly. The fixed component has at least one accommodation room, a guiding portion, and a first positioner. The first electronic component is located in the at least one accommodation room. The first assembly includes an engagement component and a return component. The engagement component is pivotably disposed on the fixed component and includes a first protrusion part, a first press part, and a second positioner. The return component is configured to push the engagement component so as to keep the engagement component in an engaged position. The second electronic component is fixed to the second assembly. The second assembly is removably inserted into the guiding portion. The second assembly includes a second protrusion part and a contact part. The engagement component is movable away from the engaged position by abutting of the second protrusion part on the first protrusion part or by abutting of the contact part on the first press part during insertion of the second assembly into the guiding portion. The first protrusion part of the engagement component in the engaged position is configured to block the second protrusion part when the second protrusion part is located between the first protrusion part and the contact part.

According to the electronic device and the quick release mechanism discussed above, the quick release mechanism enables a quick installation and removal of the second assembly.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
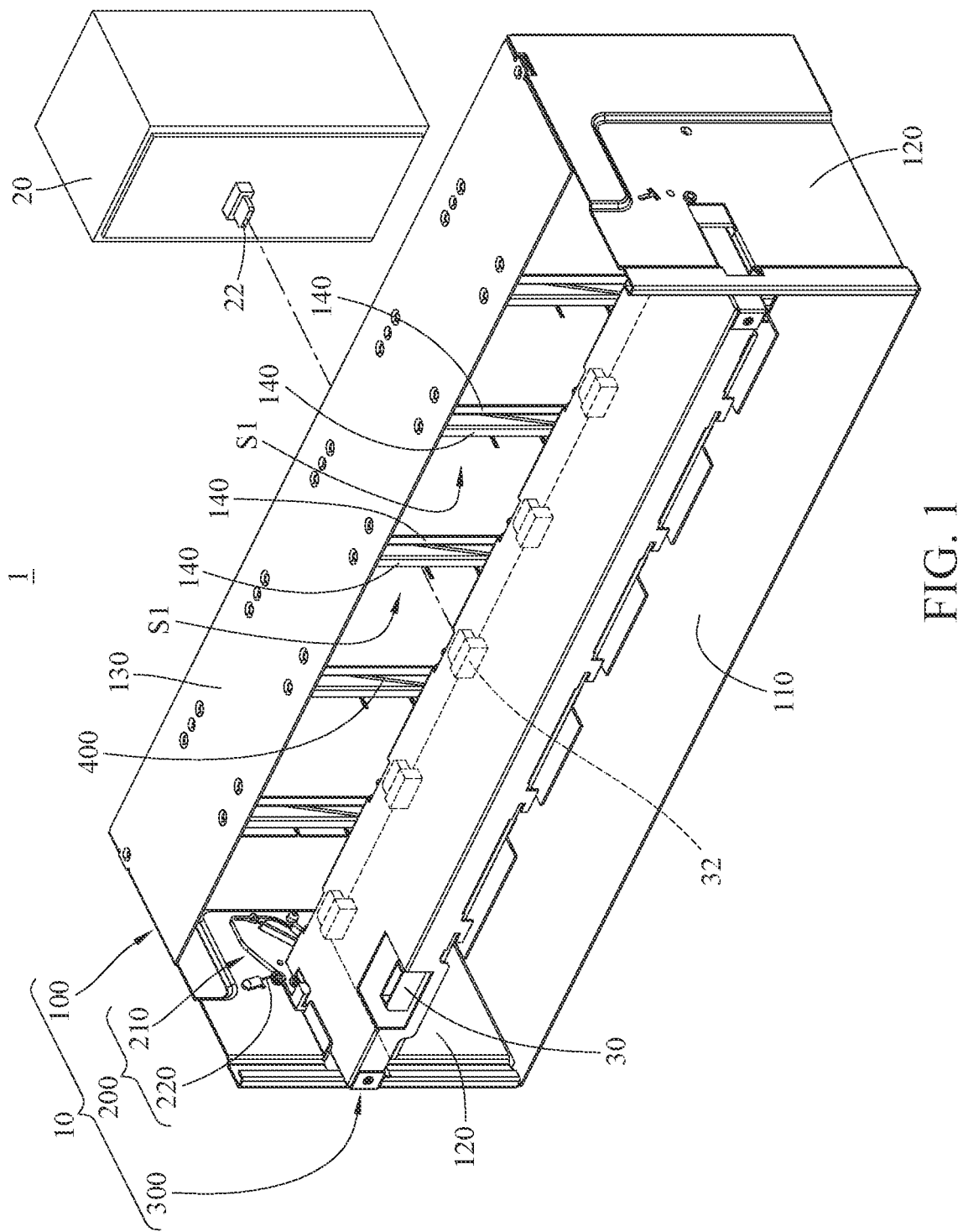
FIG. 1 is an exploded view of an electronic device according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
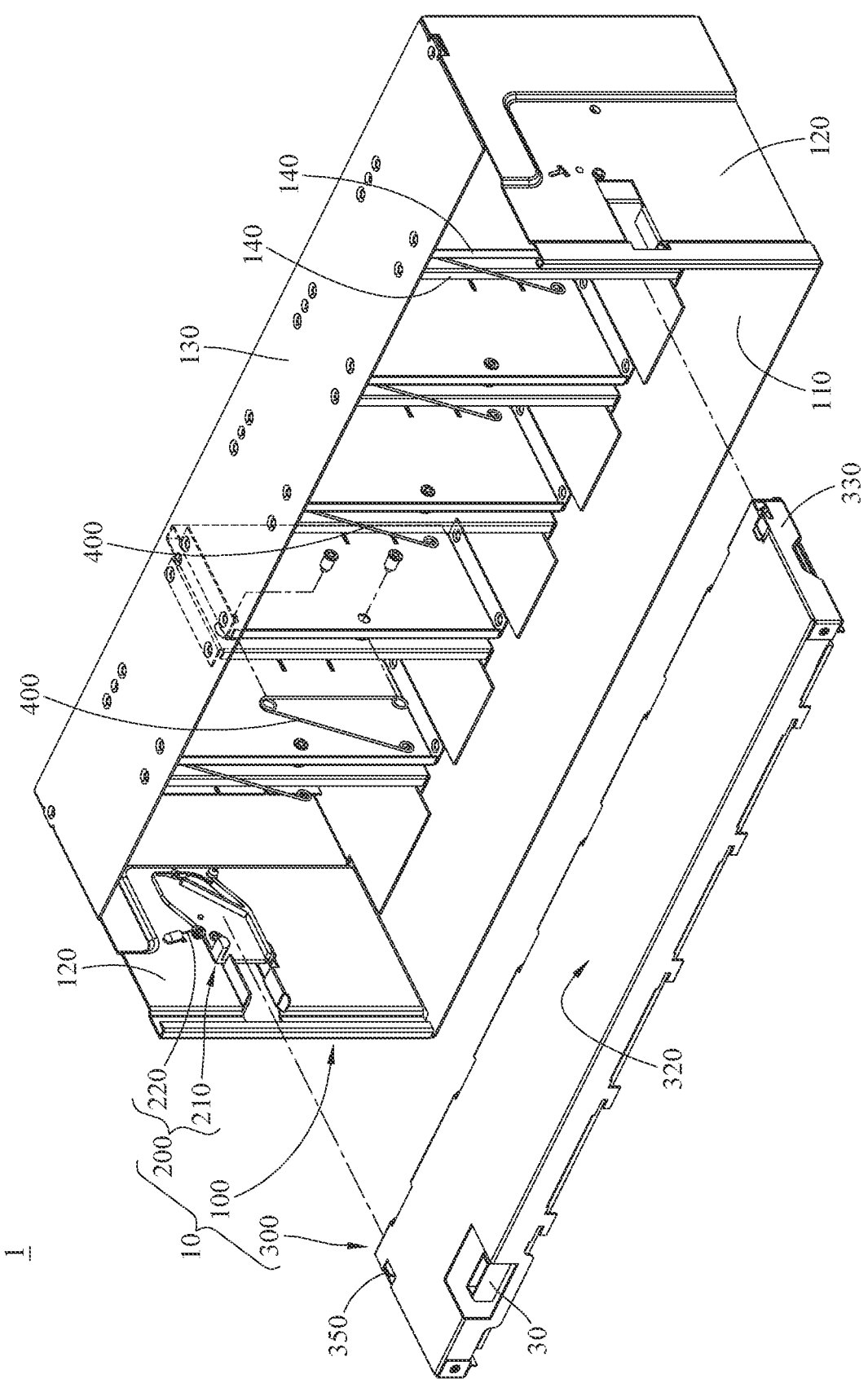
FIG. 2 is another exploded view of the electronic device in FIG. 1.
Figure 3:
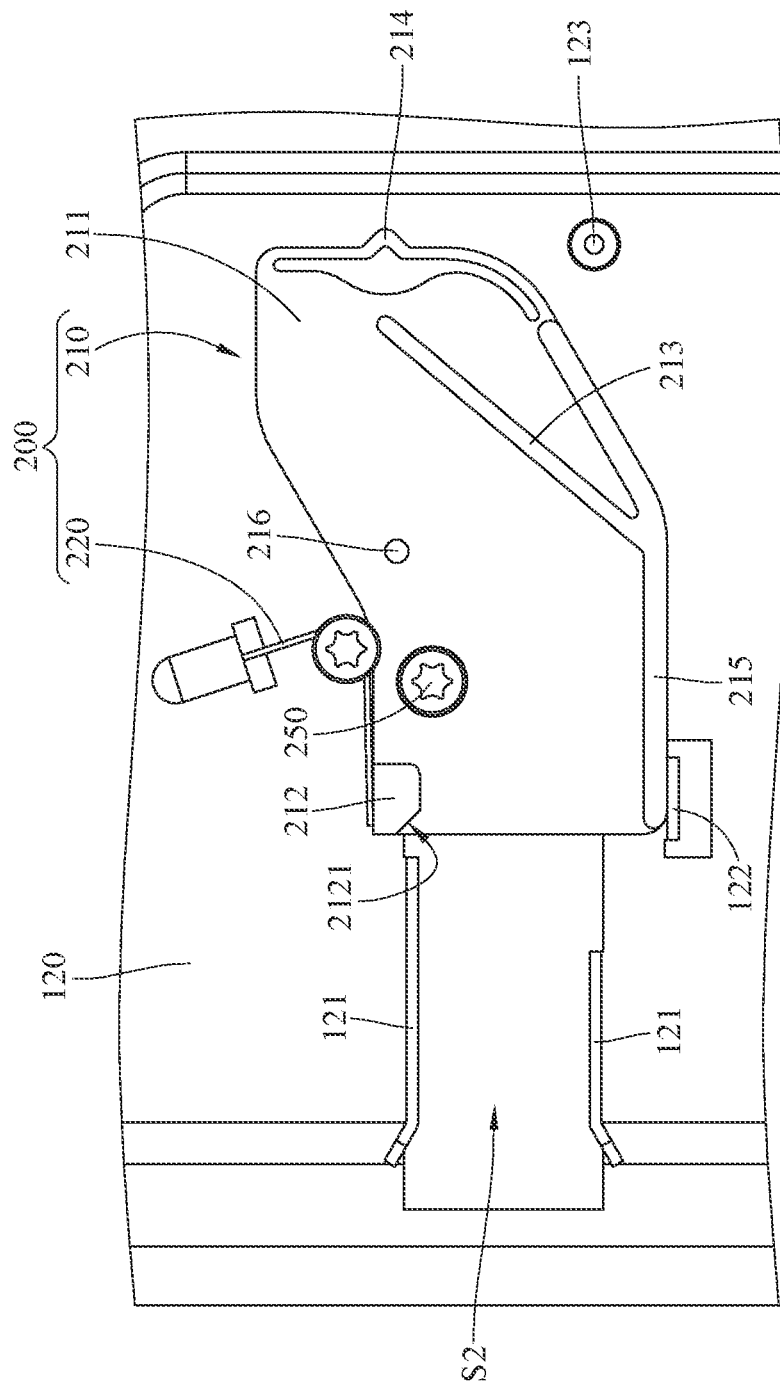
FIG. 3 is a partially side view of a quick release mechanism of the electronic device in FIG. 2.
Figure 4:
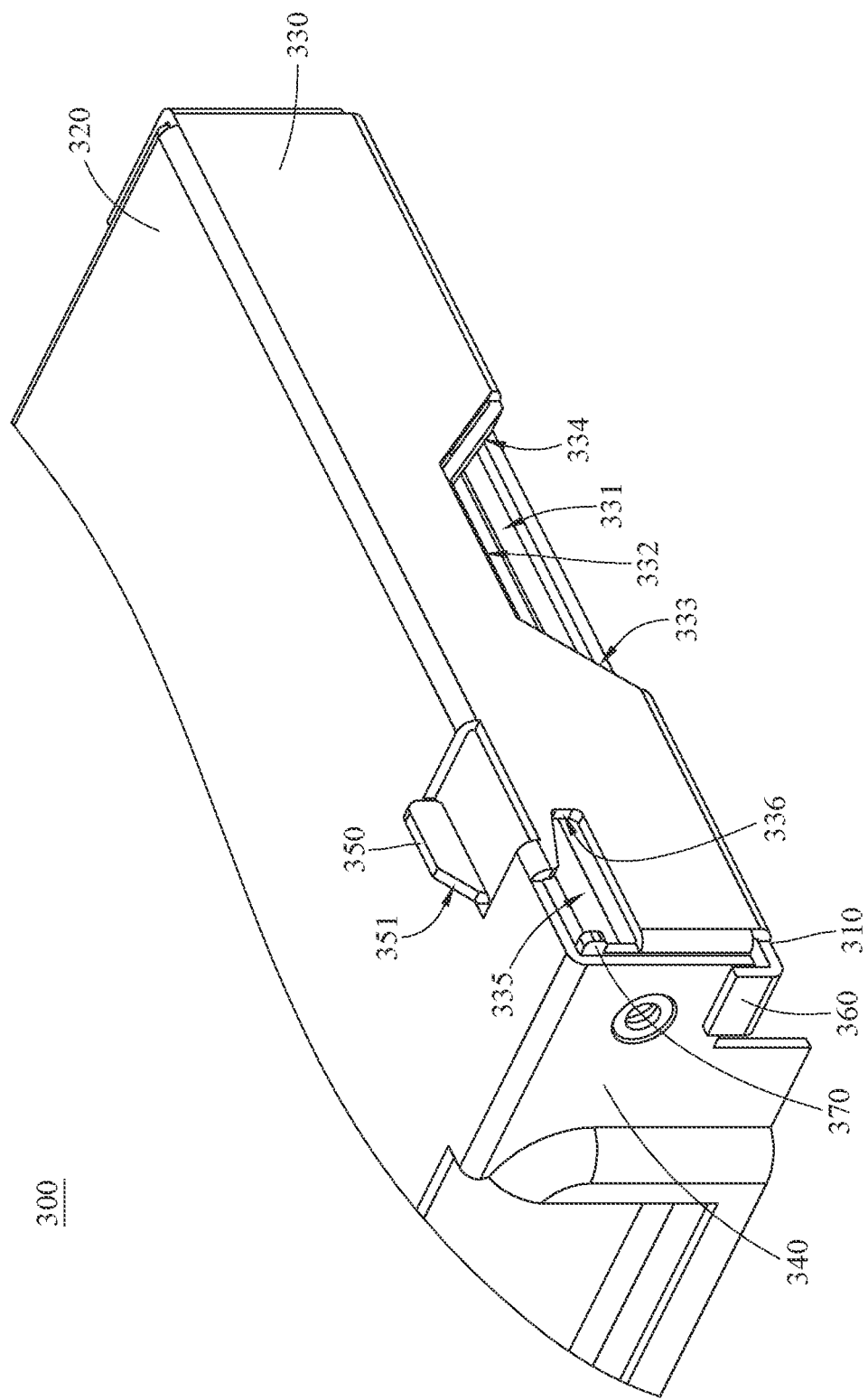
FIG. 4 is a partially and enlarged view of the quick release mechanism in FIG. 2.

Please refer to FIG. 1 to FIG. 4, where FIG. 1 is an exploded view of an electronic device according to a first embodiment of the present disclosure, FIG. 2 is another exploded view of the electronic device in FIG. 1, FIG. 3 is a partially side view of a quick release mechanism of the electronic device in FIG. 2, and FIG. 4 is a partially and enlarged view of the quick release mechanism in FIG. 2.

The first embodiment of the present disclosure provides an electronic device 1 including a first electronic component 20, a second electronic component 30, and a quick release mechanism 10. The first electronic component 20 may be a fan. The first electronic component 20 has a first electrical connector 22. The second electronic component 30 may be a fan backplane. The second electronic component 30 has a plurality of second electrical connectors 32. The second electrical connectors 32 is configured to be electrically connected to one of the first electrical connector 22.

The quick release mechanism 10 is provided to facilitate the connection and disconnection of the first electronic component 20 and the second electronic component 30. The detailed descriptions will be provided hereinafter.

The quick release mechanism 10 includes a fixed component 100, two first assemblies 200, and a second assembly 300. The fixed component 100 includes a bottom board 110, two lateral boards 120, and a top board 130. The lateral boards 120 are connected to and located between the bottom board 110 and the top board 130. The lateral boards 120 may be the same in configuration, therefore only one lateral board 120 will be described in detail hereinafter. The lateral board 120 has two rail parts 121, a stopper 122, and a first positioner 123. The rail parts 121 define a groove S2 of a guiding portion therebetween. The detailed descriptions of the stopper 122 and the first positioner 123 will be illustrated later.

Understandably, there are two lateral boards 120 with the rail parts 121, the stoppers 122, and the first positioners 123 respectively arranged at two opposite sides of the electronic device 1. In some other embodiments, the electronic device may only have one lateral board with the rail parts, the stopper, and the first positioner at one side thereof and one lateral board without any rail part, stopper, and first positioner at the other side thereof.

The fixed component 100 may further include a plurality of partitions 140. The partitions 140 divide the internal space of the fixed component 100 into a plurality of accommodation rooms S1. As shown, the partitions 140 are arranged in plural pairs separated from one another, and each accommodation room S1 is defined by two adjacent pairs of the partitions 140, but the disclosure is not limited thereto. In other embodiments, each accommodation room may be spaced apart by only one partition.

The first assemblies 200 may be the same in configuration, therefore only one first assembly 200 will be described in detail hereinafter. In addition, in some other embodiments, the quick release mechanism may include only one first assembly provided to correspond to the lateral board with the rail parts, the stopper, and the first positioner at the one side of the electronic device.

The first assembly 200 includes an engagement component 210 and a return component 220. The engagement component 210 may be pivotably disposed on the lateral board 120 of the fixed component 100 via a pivot 250 (e.g., a step screw). The engagement component 210 includes a main part 211, a first protrusion part 212, a first press part 213, a second press part 215, and a second positioner 214. The first protrusion part 212, the first press part 213, and the second press part 215 protrude from the same side of the main part 211, and the second press part 215 is located closer to the groove S2 of the guiding portion than the first press part 213. The first press part 213 and the second press part 215 may each extend in a straight line. In some other embodiments, the first and second press parts may each extend along a curve line or another shape of line.

Figure 5:
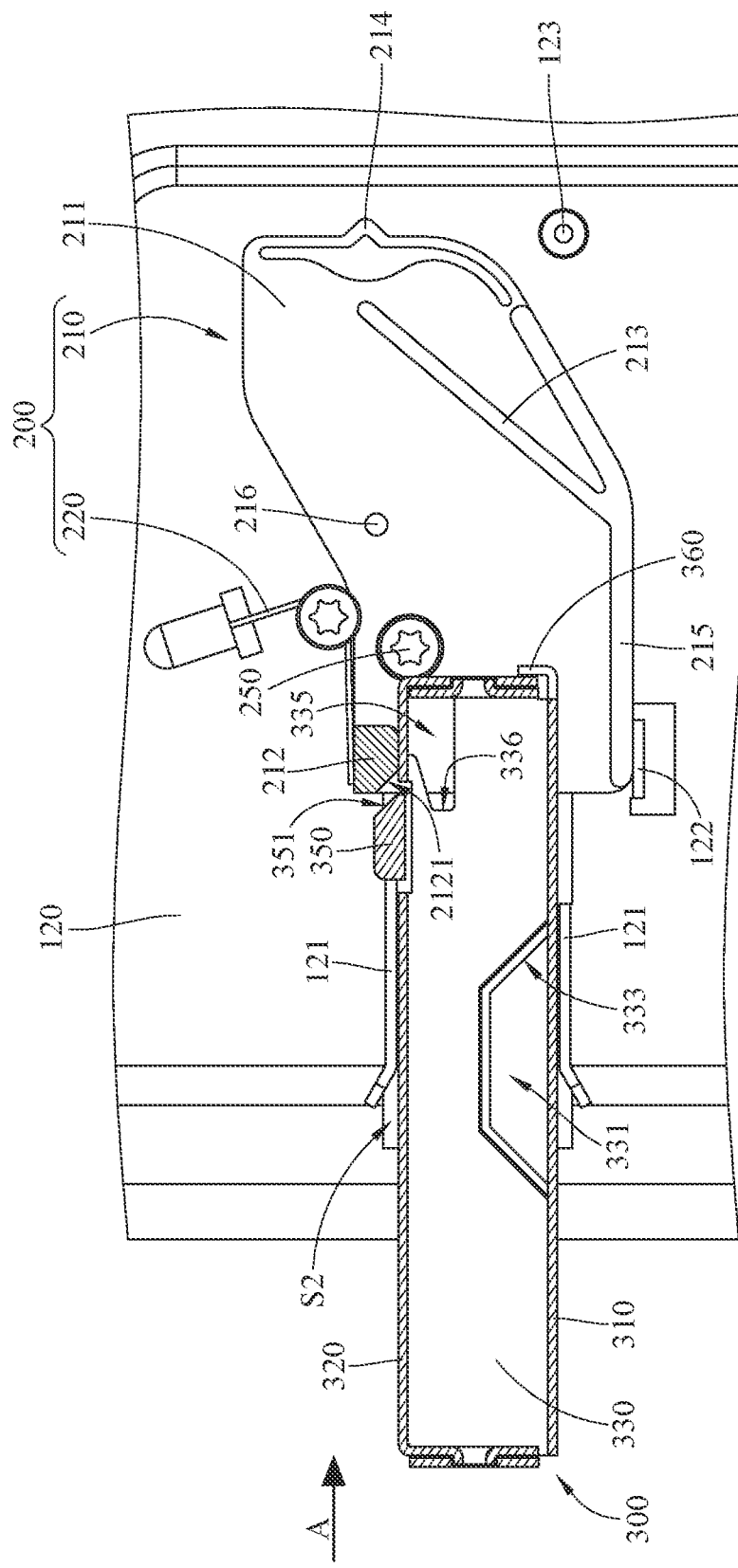
FIG. 5 to FIG. 17 are schematic views showing operation processes of the electronic device in FIG. 1.

The return component 220 may be a torsion spring fixed on the lateral board 120. Specifically, the return component 220 may have two arms respectively fixed on the lateral board 120 and in contact with the engagement component 210, such that the return component 220 is able to push the engagement component 210 and make it press against the stopper 122. As shown in FIG. 5, when the engagement component 210 presses against the stopper 122, the engagement component 210 is in an engaged position, and the second press part 215 is located aside the extension of the groove S2 of the guiding portion. As shown in FIG. 3 or FIG. 5, the second press part 215 is located below the extension of the groove S2 of the guiding portion.

Note that the return component may be a compression spring or an extension spring and arranged to a proper position to achieve the same function as discussed above.

The second positioner 214 protrudes from a side of the main part 211 located away from the groove S2 of the guiding portion and extends in a direction away from the groove S2 of the guiding portion. The second positioner 214 is elastic and is configured to interact with the first positioner 123 to secure a released position of the engagement component 210 (please refer to FIG. 11).

The second electronic component 30 is fixed to the second assembly 300, and at least part of the second assembly 300 is removably and slidably located in the groove S2 of the guiding portion. The second assembly 300 includes a bottom plate 310, a top plate 320 and two lateral plates 330. The lateral plates 330 are connected to and located between the bottom plate 310 and the top plate 320. The lateral plates 330 each have a hollow part 331, a bottom surface 332, a first lateral surface 333, and a second lateral surface 334. The bottom surface 332 is connected to and located between the first lateral surface 333 and the second lateral surface 334. The hollow part 331 is defined by the bottom surface 332, the first lateral surface 333, and the second lateral surface 334. The first lateral surface 333 is located closer to the first press part 213 than the second lateral surface 334. During the removal of the second assembly 300 from the groove S2 of the guiding portion, the first lateral surface 333 is able to push the second press part 215 so as to release the second positioner 214 from the first positioner 123.

In this embodiment, the second assembly 300 may further include a second protrusion part 350 protruding outward from the top plate 320. During the insertion of the second assembly 300 into the groove S2 of the guiding portion, the second protrusion part 350 is able to push the first protrusion part 212 away so as to force the engagement component 210 to pivot towards the released position. As the second protrusion part 350 passes over the first protrusion part 212, the return component 220 then moves the engagement component 210 back to its original position by pushing the first protrusion part 212. Then, a side of the second protrusion part 350 close to the rail parts 121 is blocked by the first protrusion part 212. By doing so, the second electronic component 30 can be installed in position on the fixed component 100. As discussed, the quick release mechanism 10 enables a quick and simple step of installing the second electronic component 30.

In this embodiment, the second assembly 300 further includes a front plate 340 and an contact part 360. The front plate 340 is connected to the top plate 320. The contact part 360 is connected to the bottom plate 310 and is located outside the front plate 340. The contact part 360 is configured to push the first press part 213. During the insertion of the second electronic component 30, the contact part 360 pushes the first press part 213 and therefore forces the engagement component 210 to pivot towards the released position and forces the second positioner 214 to slide over the first positioner 123. Meanwhile, the first protrusion part 212 is moved away from the second electronic component 30.

Optionally, in this embodiment, the quick release mechanism 10 may further include a plurality of elastic components 400 respectively located in the gaps defined by the pairs of the partitions 140. The elastic components 400 are configured to provide force to move the second assembly 300 out of the groove S2 of the guiding portion.

In this embodiment, the engagement component 210 may further include a first stopper 216 protruding from the main part 211. The second assembly 300 may further include a second stopper 370 protruding from the lateral plate 330. When the engagement component 210 is in the engaged position (as shown in FIG. 5), the first stopper 216 is located aside the extension of the groove S2 of the guiding portion; that is, the first stopper 216 is not on the way of the second electronic component 30. While the second assembly 300 is inserted into the groove S2 of the guiding portion, the second protrusion part 350 causes the engagement component 210 to pivot so as to move the first stopper 216 to in front of the second stopper 370. Thus, the first stopper 216 is able to stop the second stopper 370 so as to stop the insertion of the second assembly 300. At this moment, the contact part 360 is not yet in physical contact with the first press part 213.

Optionally, in this embodiment, the lateral plate 330 may further has a recess 335 and a limiting surface 336, the second stopper 370 and the limiting surface 336 are respectively located at two opposite sides of the recess 335. When the contact part 360 pushes the first press part 213, the first stopper 216 is movably located in the recess 335 and is not in physical contact with the lateral plate 330 of the second assembly 300, thereby preventing interference between the first stopper 216 and the lateral plate 330. Further, when the first stopper 216 contacts the limiting surface 336, the first positioner 123 and the second positioner 214 are engaged with each other.

In this embodiment, the first protrusion part 212 has a first inclined guide surface 2121, and the second protrusion part 350 has a second inclined guide surface 351. During the insertion of the second assembly 300 into the groove S2 of the guiding portion, the interaction between the first inclined guide surface 2121 and the second inclined guide surface 351 guides the pivoting of the engagement component 210.

Please refer to FIG. 5 to FIG. 17, which are schematic views showing operation processes of the electronic device in FIG. 1

As shown in FIG. 5, the engagement component 210 is in the engaged position, the second assembly 300 is initially inserted into the groove S2 of the guiding portion, and the second protrusion part 350 is not yet in physical contact with the first protrusion part 212.

Figure 6:
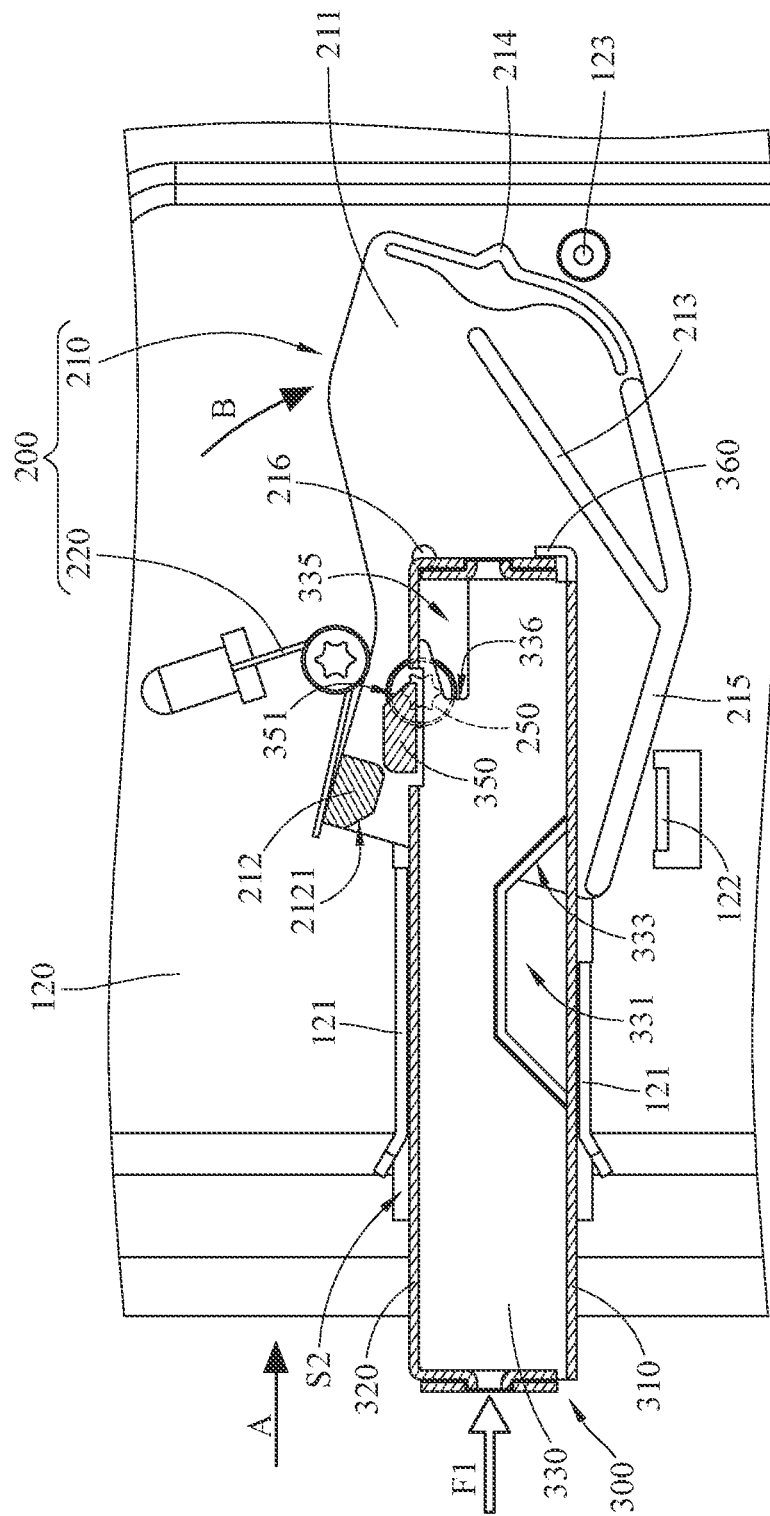
Figure 7:
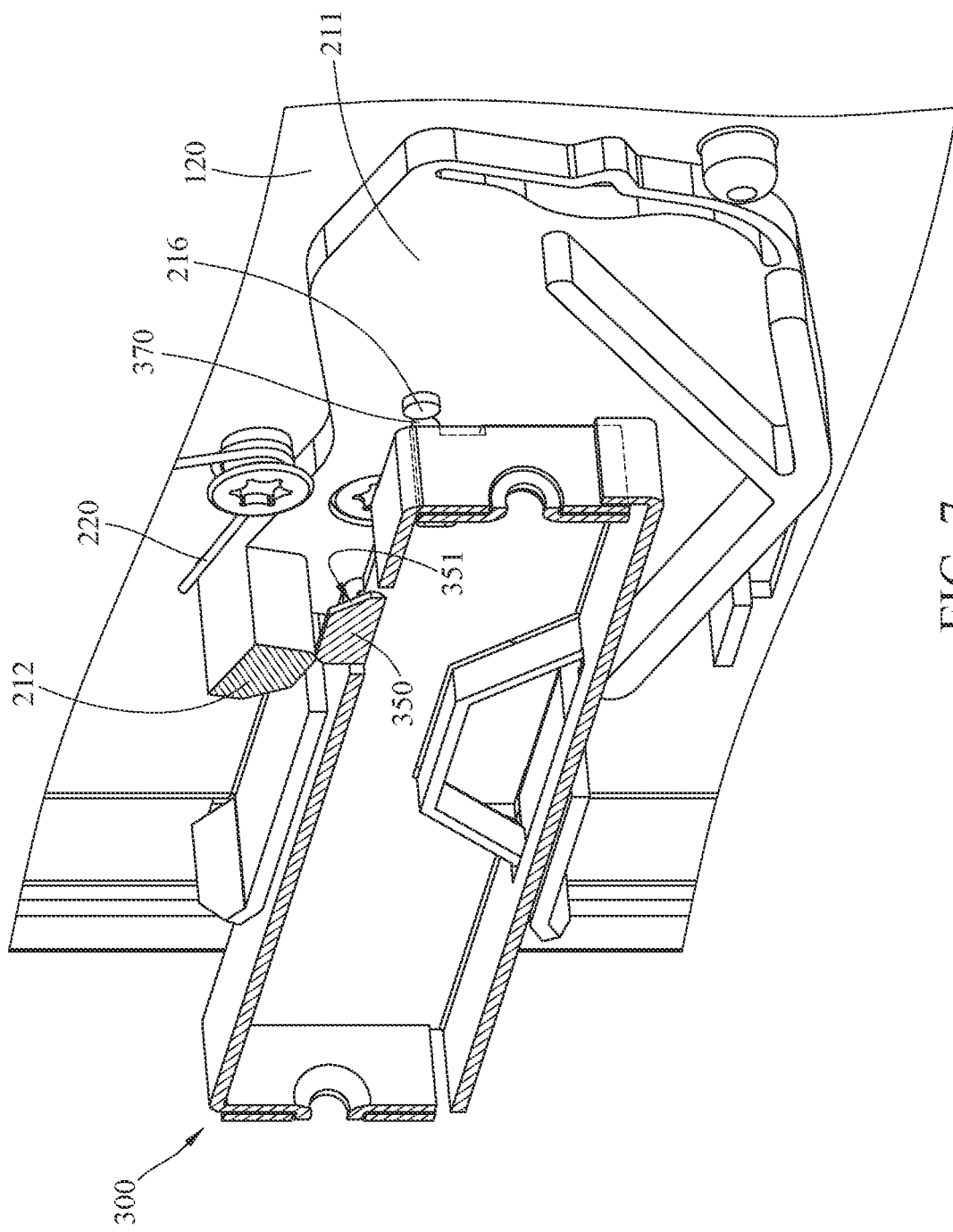

Then, as shown in FIG. 6 and FIG. 7, the second assembly 300 is pushed (e.g., an external force F1 denoted in FIG. 6) to be further inserted into the groove S2 of the guiding portion along a direction A, such that the second protrusion part 350 pushes the first protrusion part 212 away so as to force the engagement component 210 to pivot towards the released position along a direction B. Meanwhile, the first stopper 216 is moved to in front of the second stopper 370 to stop the second stopper 370 so as to stop the insertion of the second assembly 300. At this moment, the contact part 360 is not yet in physical contact with the first press part 213, and the second positioner 214 is not yet interacted with the first positioner 123. If the second positioner 214 slides over the first positioner 123, the engagement component 210 would be located at the released position and cannot be engaged with the second assembly 300. The detailed descriptions of the released position will be illustrated later.

Figure 8:
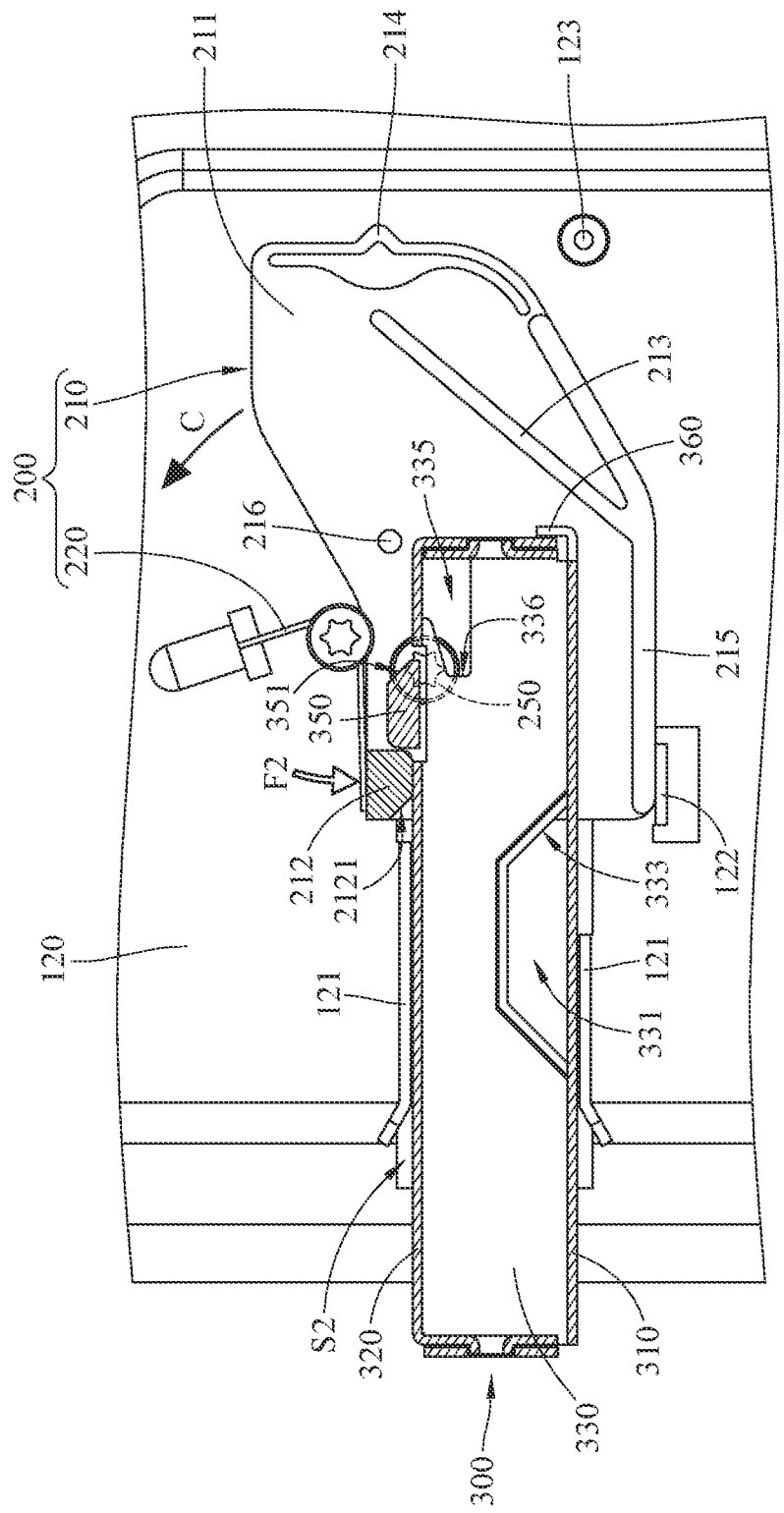

As shown in FIG. 8, when the second protrusion part 350 passes over the first protrusion part 212, the first protrusion part 212 is pushed by the return component 220 (e.g., an external force F2) so as to force the engagement component 210 to return to its original engaged position along a direction C. Meanwhile, the first protrusion part 212 is moved to a side of the second protrusion part 350 close to the rail parts 121 so as to prevent unwanted removal of the second assembly 300. Accordingly, the second assembly 300 can be quickly installed in position on the fixed component 100 through the quick release mechanism 10.

Figure 9:
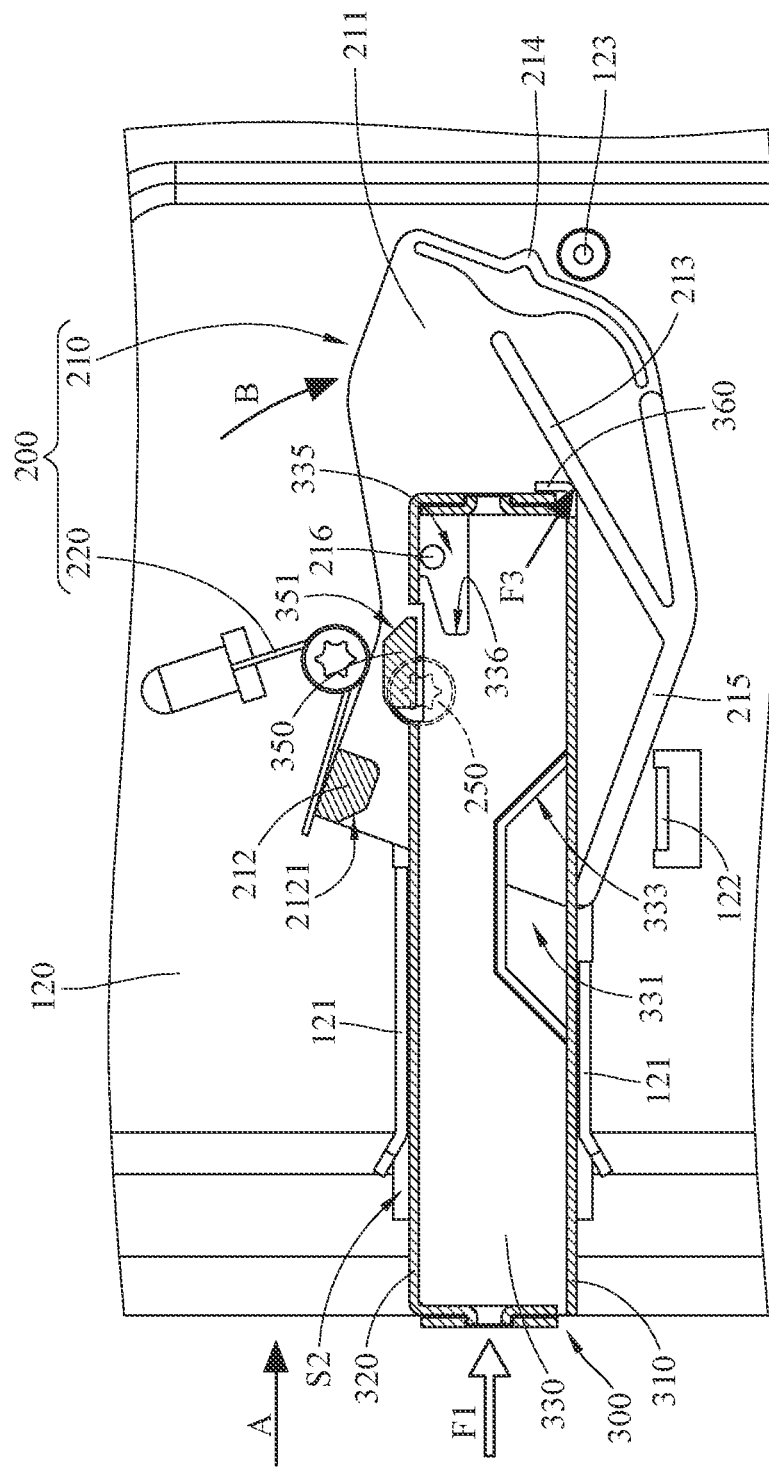
Figure 10:
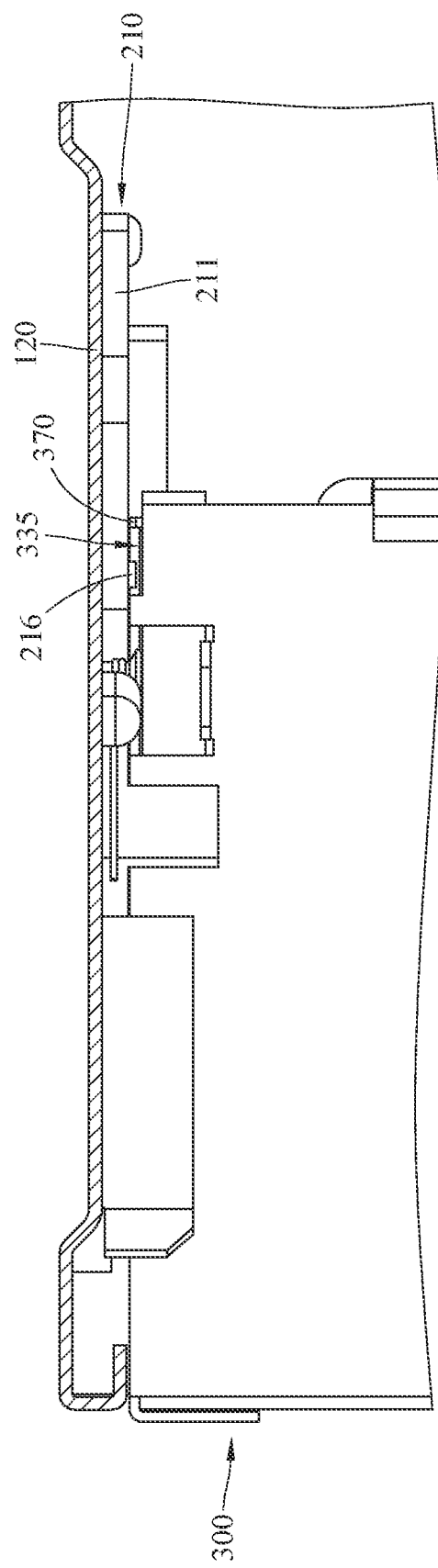

Then, as shown in FIG. 9 and FIG. 10, in order to remove the second assembly 300 from the first assembly 200, the second assembly 300 can be further pushed along the direction A (e.g., the external force F1 denoted in FIG. 9), such that the contact part 360 pushes the first press part 213 (e.g., an external force F3 denoted in FIG. 9) so as to pivot the engagement component 210 further towards the released position along the direction B. During the pivoting of the engagement component 210 further towards the released position, the first stopper 216 is movably located in the recess 335, thereby preventing interference between the first stopper 216 and the lateral plate 330.

Figure 11:
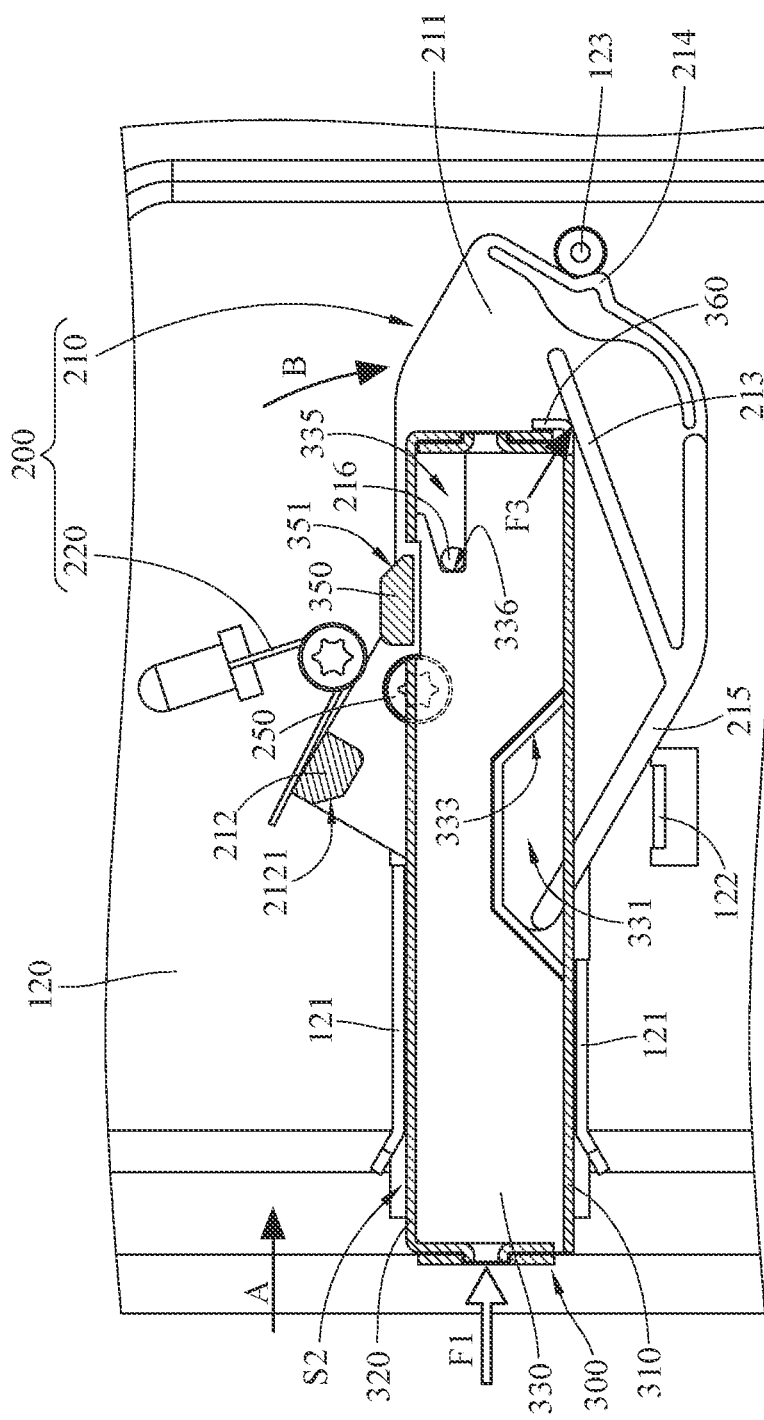

Then, as shown in FIG. 11, the engagement component 210 is continuously pivoted along the direction B until the second positioner 214 slide over the first positioner 123. As such, the second positioner 214 is engaged with the first positioner 123, and the engagement component 210 is in the released position. That is, the engagement between the second assembly 300 and the first assembly 200 is released. At this time, the first stopper 216 contacts the limiting surface 336 so as to stop the movement of the second assembly 300 along the direction A. Meanwhile, the second press part 215 is located in the hollow part 331, and the detailed descriptions of the second press part 215 will be provided later.

Figure 12:
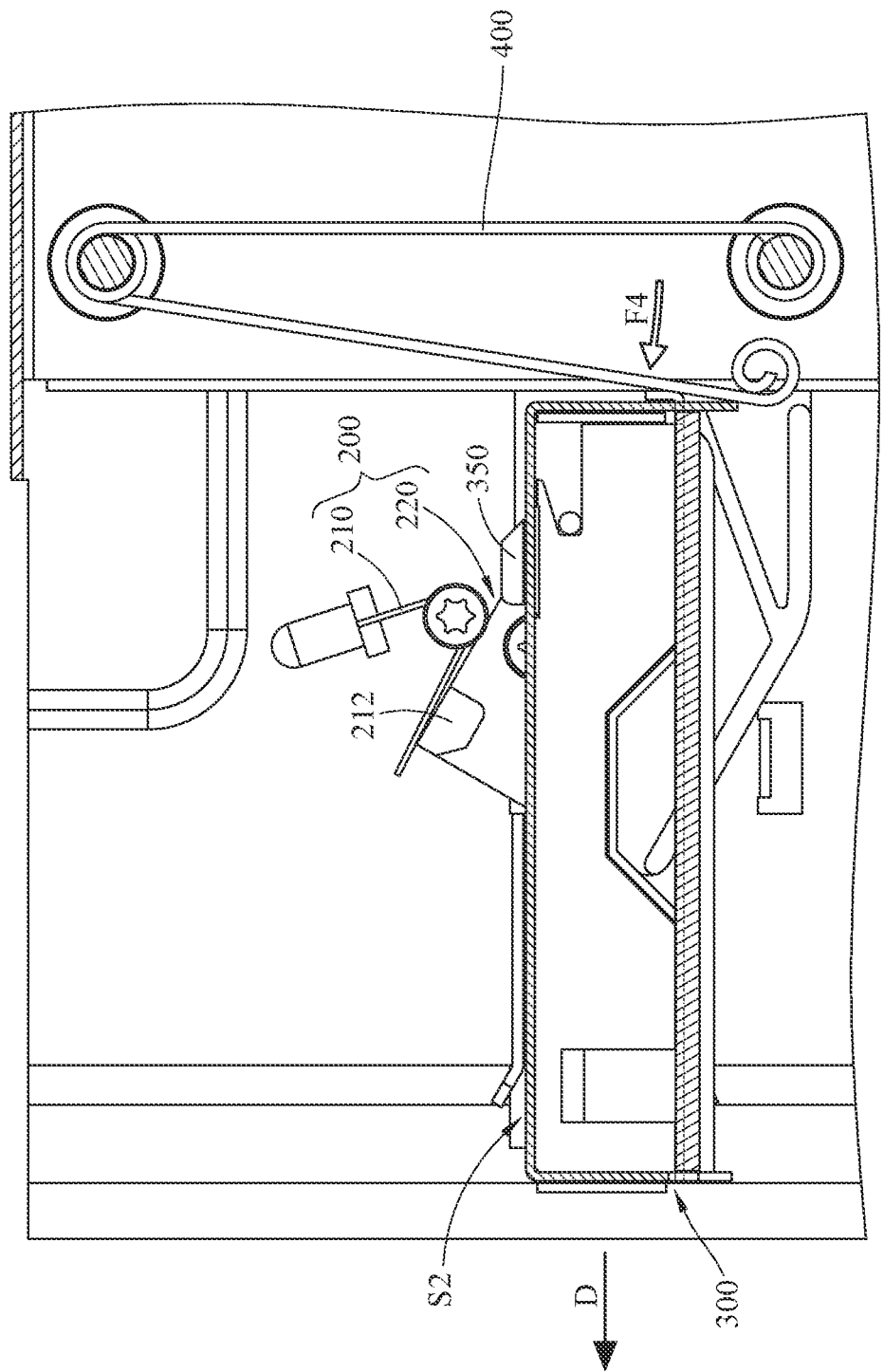
Figure 13:
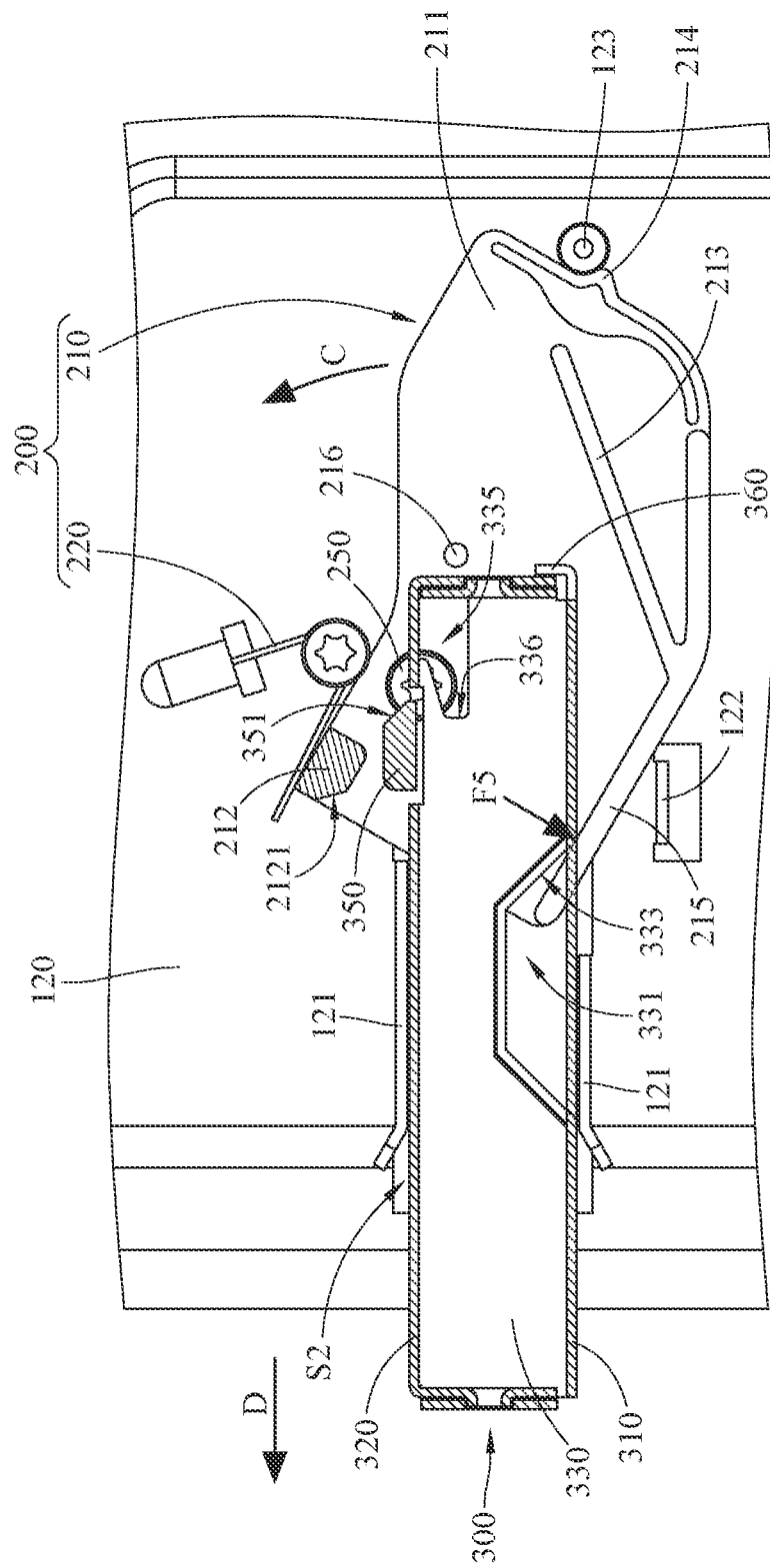
Figure 14:
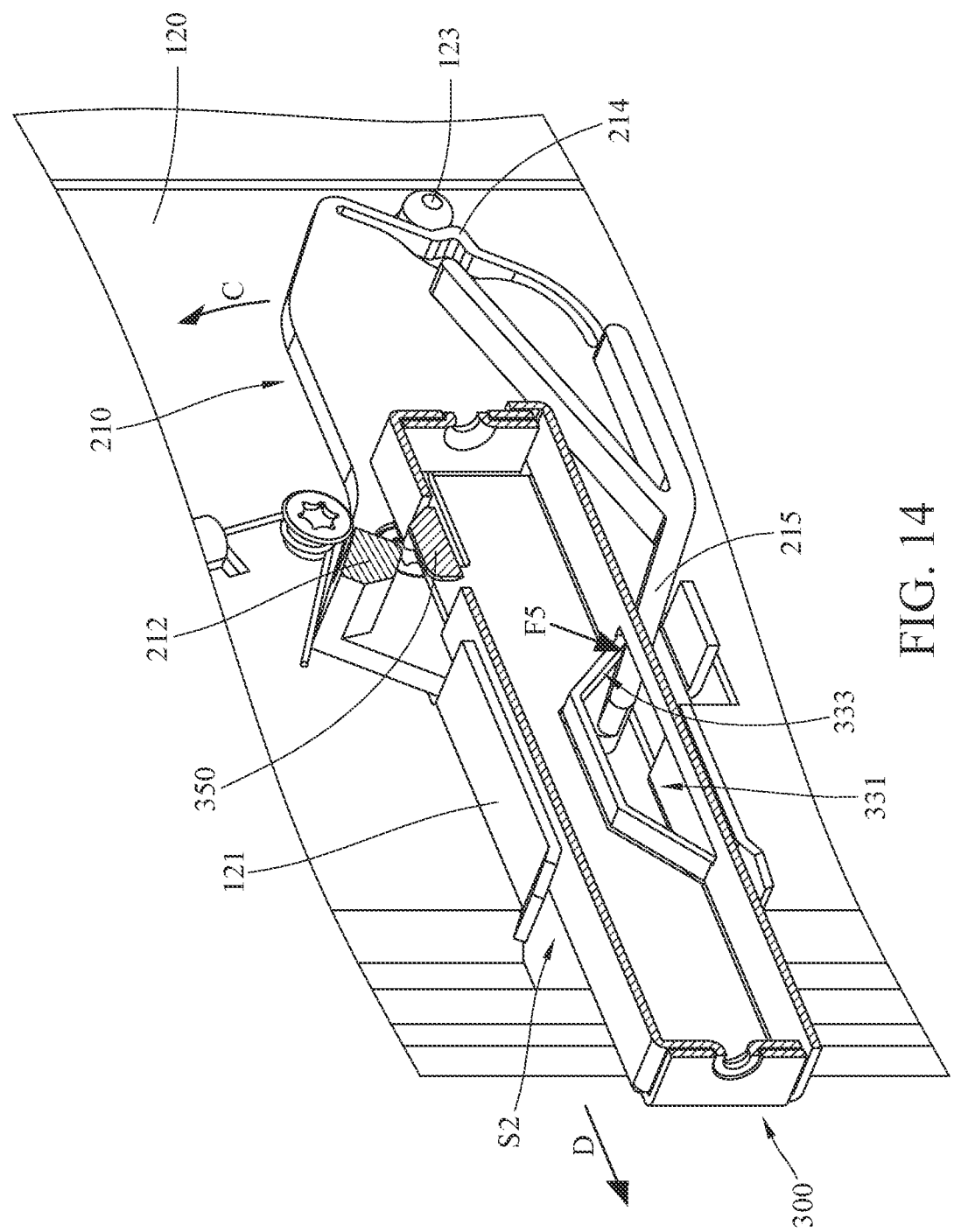
Figure 15:
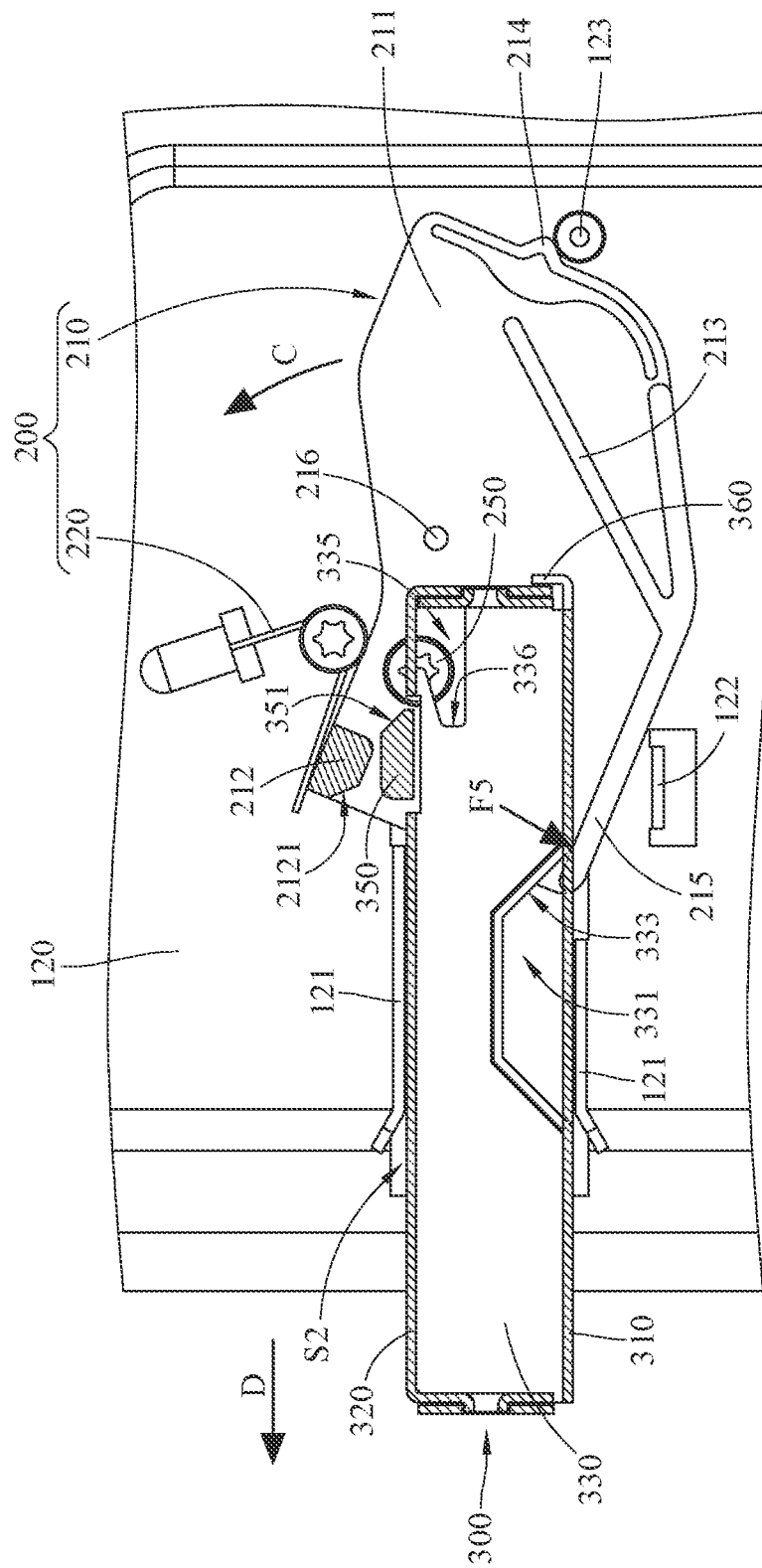
Figure 16:
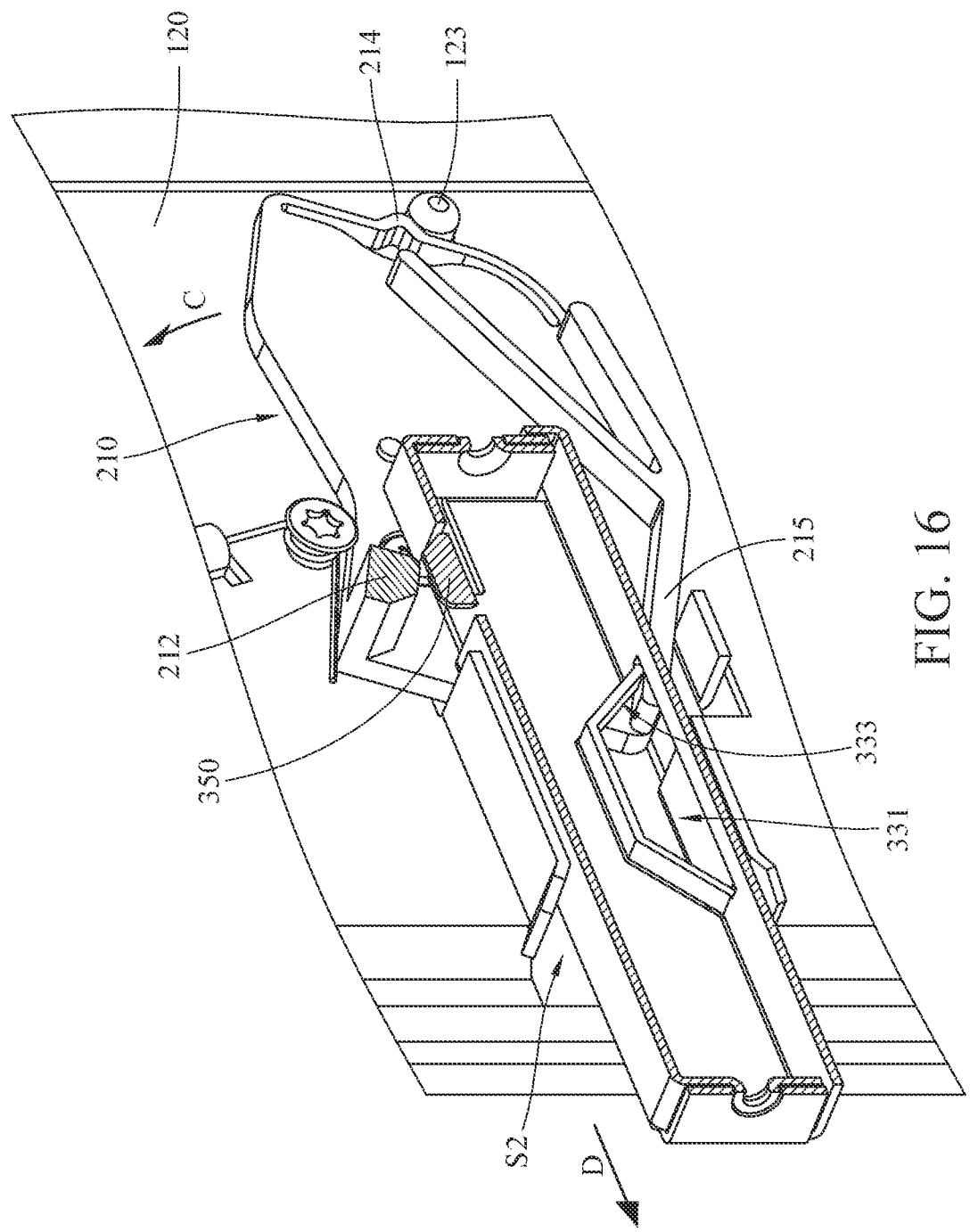

Then, as shown in FIG. 12, the elastic component 400 provides an elastic force (e.g., an external force F4) to move the second assembly 300 out of the groove S2 of the guiding portion along a direction D.

Then, as shown in FIG. 13 to FIG. 16, during the removal of the second assembly 300 from the groove S2 of the guiding portion along the direction D, the first lateral surface 333 pushes the second press part 215 (e.g., an external force F5 denoted in FIG. 13 to FIG. 15) so as to pivot the engagement component 210 along a direction C and therefore force the second positioner 214 to release from the first positioner 123.

During the pivoting of the engagement component 210 along the direction C, the second protrusion part 350 is already on the way of the first protrusion part 212. Specifically, in the direction in parallel with the groove S2 of the guiding portion, the second protrusion part 350 is not blocked by the first protrusion part 212. Therefore, the second assembly 300 can continuously move out of the groove S2 of the guiding portion along the direction D.

Note that the second positioner 214 of the engagement component 210 is configured to be engaged with the first positioner 123 at the beginning of the removal of the second assembly 300. Therefore, the pivoting angle of the engagement component 210 during the removal of the second assembly 300 is greater than the pivoting angle of the engagement component 210 during the insertion of the second assembly 300. As such, the second positioner 214 can slide over the first positioner 123 to stop the movement of the engagement component 210 back to the engaged position.

Figure 17:
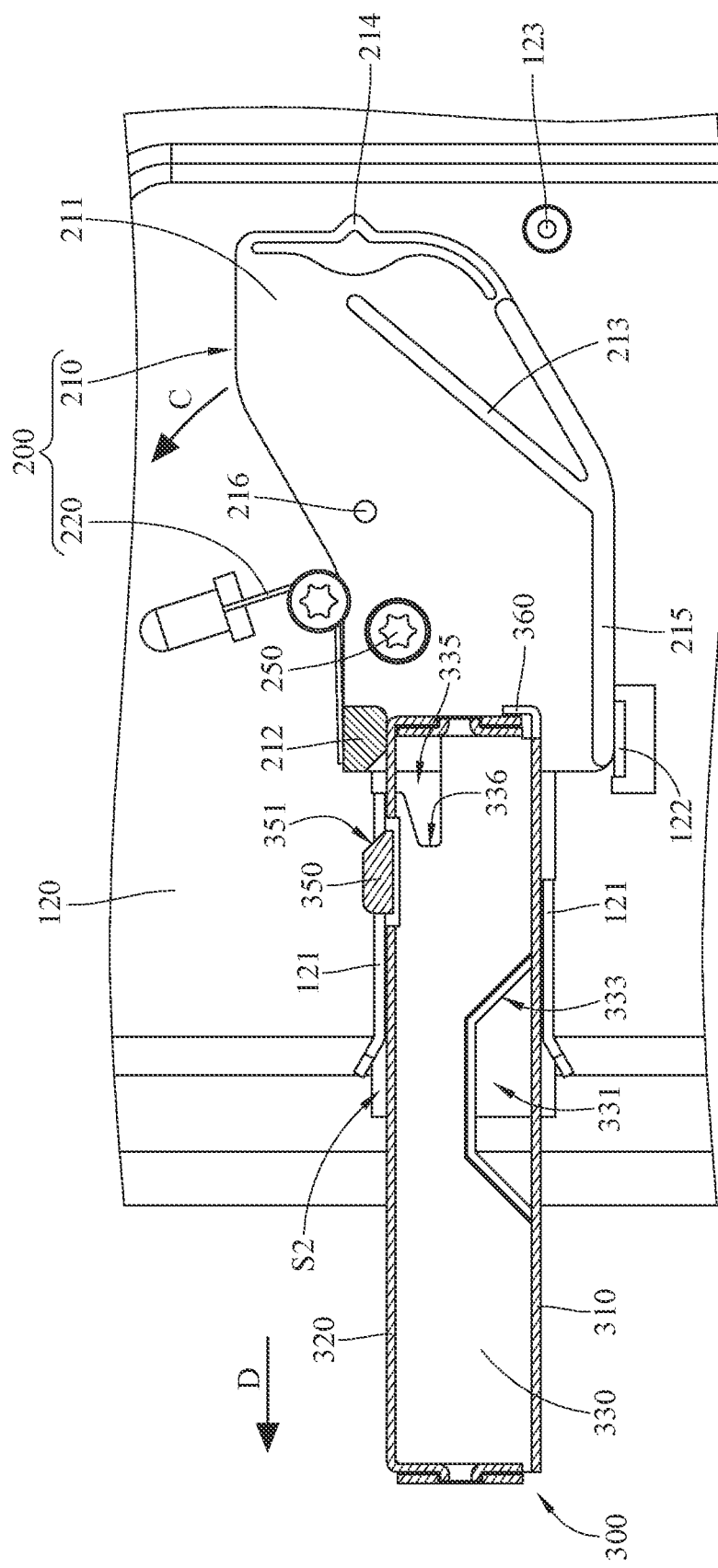

Then, as shown in FIG. 17, when the second protrusion part 350 passes over the first protrusion part 212 during the removal of the second assembly 300 along the direction D, the return component 220 moves the engagement component 210 back to the engaged position. Accordingly, the engagement component 210 returns to its original position for the next insertion of the second assembly 300.

According to the electronic device and the quick release mechanism discussed above, the quick release mechanism enables a quick installation and removal of the second assembly. Further, the first stopper, the second stopper, and the limiting surface are able to prevent the second assembly from being overly inserted. Furthermore, the elastic components are provided to assist the removal of the second assembly.

The embodiments are chosen and described in order to best explain the principles of the present disclosure and its practical applications, to thereby enable others skilled in the art best utilize the present disclosure and various embodiments with various modifications as are suited to the particular use being centerboard. It is intended that the scope of the present disclosure is defined by the following claims and their equivalents.

What is claimed is:

1. A quick release mechanism, comprising:
a fixed component, having a guiding portion and a first positioner;
a first assembly, comprising an engagement component and a return component, wherein the engagement component is pivotably disposed on the fixed component, the engagement component comprises a first protrusion part, a first press part, and a second positioner, and the return component is configured to push the engagement component so as to keep the engagement component in an engaged position; and
a second assembly, removably inserted into the guiding portion, wherein the second assembly comprises a second protrusion part and a contact part;
wherein the engagement component is movable away from the engaged position by abutting of the second protrusion part on the first protrusion part or by abutting of the contact part on the first press part during insertion of the second assembly into the guiding portion, and the first protrusion part of the engagement component in the engaged position is configured to block the second protrusion part when the second protrusion part is located between the first protrusion part and the contact part.

2. The quick release mechanism according to claim 1, wherein the fixed component comprises a bottom board, two lateral boards, and a top board, the lateral boards are connected to and located between the bottom board and the top board, at least one of the lateral boards has two rail parts and a stopper, the rail parts define the guiding portion, the first positioner is located on the at least one of the lateral boards having the rail parts, and the stopper blocks a side of the engagement component located away from the return component.

3. The quick release mechanism according to claim 2, wherein the fixed component further comprises at least one partition that is located between the lateral boards and divides an internal space of the fixed component into a plurality of accommodation rooms for accommodating a plurality of objects.

4. The quick release mechanism according to claim 3, further comprising at least one elastic component that is disposed adjacent to the at least one partition and is configured to provide force to move the second assembly out of the guiding portion.

5. The quick release mechanism according to claim 4, wherein a quantity of the at least one partition is plural, a quantity of the at least one elastic component is plural, the partitions are arranged in plural pairs, each of the plurality of accommodation rooms is defined by two adjacent pairs of the partitions, and the elastic components are respectively located in gaps defined by the pairs of the partitions.

6. The quick release mechanism according to claim 1, wherein the engagement component of the first assembly comprises a main part and a second press part, the first protrusion part, the first press part, and the second press part protrude from the main part, the second press part is located closer to the guiding portion than the first press part, the second assembly comprises a bottom plate, a top plate, and two lateral plates, the lateral plates are connected to and located between the bottom plate and the top plate, at least one of the lateral plates has a hollow part, a bottom surface, a first lateral surface, and a second lateral surface, the bottom surface is connected to and located between the first lateral surface and the second lateral surface, the hollow part is defined by the bottom surface, the first lateral surface, and the second lateral surface, and the first lateral surface is located closer to the first press part than the second lateral surface; while the second assembly moves out of the guiding portion, the first lateral surface is configured to push the second press part so as to release the second positioner from the first positioner.

7. The quick release mechanism according to claim 6, wherein the engagement component of the first assembly further comprises a first stopper that protrudes from the main part, and the second assembly further comprises a second stopper; when the engagement component is in the engaged position, the first stopper is located aside an extension of the guiding portion; while the second assembly is inserted into the guiding portion, the second protrusion part pushes the first protrusion part so that the first stopper moves to a position able to stop the second stopper and the contact part is spaced apart from the first press part.

8. The quick release mechanism according to claim 7, wherein at least one of the lateral plates has a recess and a limiting surface, the second stopper and the limiting surface are respectively located at two opposite sides of the recess; when the contact part pushes the first press part, the first stopper is movably located in the recess; when the first stopper contacts the limiting surface, the first positioner and the second positioner are engaged with each other.

9. The quick release mechanism according to claim 6, wherein the second assembly further comprises a front plate connected to the top plate, and the contact part is connected to the bottom plate and is located outside the front plate.

10. The quick release mechanism according to claim 1, wherein the first protrusion part has a first inclined guide surface, the second protrusion part has a second inclined guide surface; while the second assembly is inserted into the guiding portion, the first inclined guide surface slidably contacts the second inclined guide surface.

11. An electronic device, comprising:
a first electronic component;
a second electronic component; and
a quick release mechanism, comprising:
a fixed component, having at least one accommodation room, a guiding portion, and a first positioner, wherein the first electronic component is located in the at least one accommodation room;
a first assembly, comprising an engagement component and a return component, wherein the engagement component is pivotably disposed on the fixed component, the engagement component comprises a first protrusion part, a first press part, and a second positioner, and the return component is configured to push the engagement component so as to keep the engagement component in an engaged position; and
a second assembly, wherein the second electronic component is fixed to the second assembly, the second assembly is removably inserted into the guiding portion, and the second assembly comprises a second protrusion part and a contact part;

wherein the engagement component is movable away from the engaged position by abutting of the second protrusion part on the first protrusion part or by abutting of the contact part on the first press part during insertion of the second assembly into the guiding portion, and the first protrusion part of the engagement component in the engaged position is configured to block the second protrusion part when the second protrusion part is located between the first protrusion part and the contact part.

12. The electronic device according to claim 11, wherein the fixed component comprises a bottom board, two lateral boards, and a top board, the lateral boards are connected to and located between the bottom board and the top board, at least one of the lateral boards has two rail parts and a stopper, the rail parts define the guiding portion, the first positioner is located on the at least one of the lateral boards having the rail parts, and the stopper blocks a side of the engagement component located away from the return component.

13. The electronic device according to claim 12, wherein a quantity of the at least one accommodation room is plural, the fixed component further comprises at least one partition that is located between the lateral boards and divides an internal space of the fixed component into the accommodation rooms.

14. The electronic device according to claim 13, wherein the quick release mechanism further comprises at least one elastic component that is disposed adjacent to the at least one partition and is configured to provide force to move the second assembly out of the guiding portion.

15. The electronic device according to claim 14, wherein a quantity of the at least one partition is plural, a quantity of the at least one elastic component is plural, the partitions are arranged in plural pairs, each of the accommodation rooms is defined by two adjacent pairs of the partitions, and the elastic components are respectively located in gaps defined by the pairs of the partitions.

16. The electronic device according to claim 11, wherein the engagement component of the first assembly comprises a main part and a second press part, the first protrusion part, the first press part, and the second press part protrude from the main part, the second press part is located closer to the guiding portion than the first press part, the second assembly comprises a bottom plate, a top plate, and two lateral plates, the lateral plates are connected to and located between the bottom plate and the top plate, at least one of the lateral plates has a hollow part, a bottom surface, a first lateral surface, and a second lateral surface, the bottom surface is connected to and located between the first lateral surface and the second lateral surface, the hollow part is defined by the bottom surface, the first lateral surface, and the second lateral surface, and the first lateral surface is located closer to the first press part than the second lateral surface; while the second assembly moves out of the guiding portion, the first lateral surface is configured to push the second press part so as to release the second positioner from the first positioner.

17. The electronic device according to claim 16, wherein the engagement component of the first assembly further comprises a first stopper that protrudes from the main part, and the second assembly further comprises a second stopper; when the engagement component is in the engaged position, the first stopper is located aside an extension of the guiding portion; while the second assembly is inserted into the guiding portion, the second protrusion part pushes the first protrusion part so that the first stopper moves to a position able to stop the second stopper and the contact part is spaced apart from the first press part.

18. The electronic device according to claim 17, wherein at least one of the lateral plates has a recess and a limiting surface, the second stopper and the limiting surface are respectively located at two opposite sides of the recess; when the contact part pushes the first press part, the first stopper is movably located in the recess; when the first stopper contacts the limiting surface, the first positioner and the second positioner are engaged with each other.

19. The electronic device according to claim 16, wherein the second assembly further comprises a front plate connected to the top plate, and the contact part is connected to the bottom plate and is located outside the front plate.

20. The electronic device according to claim 11, wherein the first protrusion part has a first inclined guide surface, the second protrusion part has a second inclined guide surface; while the second assembly is inserted into the guiding portion, the first inclined guide surface slidably contacts the second inclined guide surface.

* * * * *